United States Patent
Carter et al.

(10) Patent No.: US 7,846,842 B2
(45) Date of Patent: Dec. 7, 2010

(54) POLISHING COMPOSITION AND METHOD FOR HIGH SILICON NITRIDE TO SILICON OXIDE REMOVAL RATE RATIOS

(75) Inventors: Phillip W. Carter, Aurora, IL (US); Timothy Johns, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 2 days.

(21) Appl. No.: 12/364,253

(22) Filed: Feb. 2, 2009

(65) Prior Publication Data

US 2009/0137124 A1    May 28, 2009

Related U.S. Application Data

(62) Division of application No. 10/982,486, filed on Nov. 5, 2004, now Pat. No. 7,504,044.

(51) Int. Cl.
*H01L 21/304* (2006.01)
*B44C 1/22* (2006.01)

(52) U.S. Cl. .................. 438/692; 438/690; 438/691; 438/693; 216/88; 216/89; 252/79.1; 51/307

(58) Field of Classification Search ............ 438/690, 438/691, 692, 693; 216/89; 252/79.1; 51/307
See application file for complete search history.

(56) References Cited

U.S. PATENT DOCUMENTS

| | | | |
|---|---|---|---|
| 4,166,150 A | 8/1979 | Mattor et al. | |
| 4,528,384 A | 7/1985 | Schmidt et al. | |
| 5,196,353 A | 3/1993 | Sandhu et al. | |
| 5,389,352 A | 2/1995 | Wang | |
| 5,433,651 A | 7/1995 | Lustig et al. | |
| 5,439,617 A | 8/1995 | Akhavan-Tafti | |
| 5,489,233 A | 2/1996 | Cook et al. | |
| 5,527,423 A | 6/1996 | Neville et al. | |
| 5,609,511 A | 3/1997 | Moriyama et al. | |
| 5,614,444 A | 3/1997 | Farkas et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,858,813 A | 1/1999 | Scherber et al. | |
| 5,872,633 A | 2/1999 | Holzapfel et al. | |
| 5,876,490 A | 3/1999 | Ronay | |
| 5,893,796 A | 4/1999 | Birang et al. | |
| 5,949,927 A | 9/1999 | Tang | |
| 5,958,794 A | 9/1999 | Bruxvoort et al. | |
| 5,964,643 A | 10/1999 | Birang et al. | |
| 5,972,192 A | 10/1999 | Dubin et al. | |
| 5,981,454 A | 11/1999 | Small | |
| 6,043,155 A | 3/2000 | Homma et al. | |
| 6,054,183 A | 4/2000 | Zimmer et al. | |
| 6,062,968 A | 5/2000 | Sevilla et al. | |
| 6,117,000 A | 9/2000 | Anjur et al. | |
| 6,126,532 A | 10/2000 | Sevilla et al. | |
| 6,156,661 A | 12/2000 | Small | |
| 6,221,119 B1 | 4/2001 | Homola | |
| 6,245,642 B1* | 6/2001 | Satoh | 438/427 |
| 6,258,140 B1* | 7/2001 | Shemo et al. | 51/308 |
| 6,258,277 B1 | 7/2001 | Salmen et al. | |
| 6,261,433 B1 | 7/2001 | Landau | |
| 6,270,393 B1* | 8/2001 | Kubota et al. | 451/36 |
| 6,294,470 B1 | 9/2001 | Economikos et al. | |
| 6,364,744 B1 | 4/2002 | Merchant et al. | |
| 6,395,955 B1 | 5/2002 | Roe et al. | |
| 6,403,726 B1 | 6/2002 | Ward | |
| 6,410,444 B1* | 6/2002 | Kido et al. | 438/693 |
| 6,428,721 B1 | 8/2002 | Ina et al. | |
| 6,432,624 B1 | 8/2002 | Kikuchi et al. | |
| 6,440,186 B1 | 8/2002 | Sakai et al. | |
| 6,478,834 B2 | 11/2002 | Tsuchiya et al. | |
| 6,485,355 B1 | 11/2002 | Economikos et al. | |
| 6,503,418 B2 | 1/2003 | Sahota et al. | |
| 6,524,168 B2 | 2/2003 | Luo et al. | |
| 6,530,968 B2 | 3/2003 | Tsuchiya et al. | |
| 6,533,832 B2 | 3/2003 | Steckenrider et al. | |
| 6,546,939 B1 | 4/2003 | Small | |
| 6,555,299 B2 | 4/2003 | Hosokawa | |
| 6,569,769 B1 | 5/2003 | Economikos et al. | |
| 6,620,216 B2 | 9/2003 | Oshima et al. | |
| 6,648,733 B2 | 11/2003 | Roberts et al. | |
| 6,670,285 B2 | 12/2003 | Hawker et al. | |
| 6,676,718 B2 | 1/2004 | Luo et al. | |
| 6,685,983 B2 | 2/2004 | Hawker et al. | |
| 6,686,141 B2 | 2/2004 | Uchida | |

(Continued)

OTHER PUBLICATIONS

Wolf, *Silicon Processing for the VLSI Era*, 4: 369-370 (2002).

*Primary Examiner*—Shamim Ahmed
(74) *Attorney, Agent, or Firm*—Thomas E. Ombolt; Francis J. Koszyk; Steven D. Weseman

(57) ABSTRACT

The invention provides a chemical-mechanical polishing composition comprising a cationic abrasive, a cationic polymer, a carboxylic acid, and water. The invention further provides a method of chemically-mechanically polishing a substrate with the aforementioned polishing composition. The polishing composition exhibits selectivity for removal of silicon nitride over removal of silicon oxide.

18 Claims, No Drawings

U.S. PATENT DOCUMENTS

| | | |
|---|---|---|
| 6,689,554 B2 | 2/2004 | Yamada et al. |
| 6,720,264 B2 | 4/2004 | Sahota et al. |
| 6,727,050 B2 | 4/2004 | Hosokawa |
| 6,743,078 B2 | 6/2004 | McClain et al. |
| 6,776,810 B1 | 8/2004 | Cherian et al. |
| 6,787,471 B2 | 9/2004 | Kobayashi |
| 6,824,578 B2 * | 11/2004 | Uchino et al. ................ 51/307 |
| 6,866,793 B2 | 3/2005 | Singh |
| 6,867,140 B2 | 3/2005 | Wang et al. |
| 6,935,928 B2 * | 8/2005 | Uchikura et al. ............. 451/36 |
| 7,004,819 B2 | 2/2006 | Moeggenborg et al. |
| 7,005,382 B2 | 2/2006 | Nishimoto et al. |
| 7,037,351 B2 | 5/2006 | Li et al. |
| 7,044,836 B2 | 5/2006 | Sun et al. |
| 7,160,807 B2 | 1/2007 | De Rege Thesauro et al. |
| 7,183,211 B2 | 2/2007 | Konno et al. |
| 7,247,567 B2 | 7/2007 | Vacassy et al. |
| 7,306,637 B2 | 12/2007 | Cherian et al. |
| 2001/0036738 A1 * | 11/2001 | Hatanaka et al. ............ 438/693 |
| 2002/0168857 A1 | 11/2002 | Kobayashi |
| 2003/0082998 A1 * | 5/2003 | Carter et al. .................. 451/41 |
| 2003/0110710 A1 | 6/2003 | Oshima et al. |
| 2003/0139116 A1 | 7/2003 | Moeggenborg et al. |
| 2003/0153183 A1 * | 8/2003 | Konno et al. ................ 438/689 |
| 2003/0153184 A1 | 8/2003 | Wang et al. |
| 2004/0060502 A1 | 4/2004 | Singh |
| 2004/0132305 A1 * | 7/2004 | Nishimoto et al. .......... 438/690 |
| 2004/0186206 A1 | 9/2004 | Yoneda et al. |
| 2004/0209555 A1 * | 10/2004 | Sun et al. ...................... 451/41 |
| 2004/0229552 A1 | 11/2004 | Cherian et al. |
| 2004/0266196 A1 | 12/2004 | De Rege Thesauro et al. |
| 2005/0263407 A1 | 12/2005 | Brusic et al. |
| 2005/0282391 A1 | 12/2005 | Vacassy et al. |
| 2006/0096496 A1 | 5/2006 | Sun et al. |

* cited by examiner

POLISHING COMPOSITION AND METHOD FOR HIGH SILICON NITRIDE TO SILICON OXIDE REMOVAL RATE RATIOS

CROSS-REFERENCE TO RELATED APPLICATIONS

This patent application is a divisional of copending U.S. patent application Ser. No. 10/982,486, filed Nov. 5, 2004.

FIELD OF THE INVENTION

This invention pertains to a polishing composition and a method for polishing a substrate using the same.

BACKGROUND OF THE INVENTION

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer is deposited to fill the trenches. Due to variation in the depth of trenches, or lines, formed in this manner, it is typically necessary to deposit an excess of dielectric material on top of the substrate to ensure complete filling of all trenches.

The excess dielectric material (e.g., an oxide) is then typically removed by a chemical-mechanical planarization process to expose the silicon nitride layer. When the silicon nitride layer is exposed, the largest area of the substrate exposed to the chemical-mechanical polishing system comprises silicon nitride, which must then be polished to achieve a highly planar and uniform surface. Generally, past practice has been to emphasize selectivity for oxide polishing in preference to silicon nitride polishing. Thus, the silicon nitride layer has served as a stopping layer during the chemical-mechanical planarization process, as the overall polishing rate has decreased upon exposure of the silicon nitride layer. However, as oxide line widths have become smaller in next-generation devices, in some circumstances it is desirable to utilize polishing systems having selectivity for silicon nitride over oxide polishing, in order to minimize defectivity in the oxide lines formed on the substrate surface.

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Polishing compositions are typically used in conjunction with polishing pads (e.g., a polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Instead of or in addition to being suspended in the polishing composition, the abrasive material may be incorporated into the polishing pad. U.S. Pat. No. 5,958,794 discloses a fixed abrasive polishing pad.

Several chemical-mechanical polishing compositions for substrates containing low dielectric constant materials (e.g., oxide) are known. For example, U.S. Pat. No. 6,043,155 discloses a cerium oxide-based slurry for inorganic and organic insulating films, having selectivity for silicon dioxide versus silicon nitride polishing. U.S. Patent Application Publication 2002/0168857 A1 discloses a method for manufacturing a semiconductor device in which silicon dioxide is deposited on a silicon nitride film patterned with trenches, and a two-stage chemical-mechanical polishing process is then performed to selectively remove overlying silicon dioxide, thus leaving trenches filled with silicon dioxide. Thus, there remains a need in the art for polishing compositions and methods having the reverse selectivity, for polishing of silicon nitride over underlying dielectric components.

The invention provides such a composition and method. These and other advantages of the invention, as well as additional inventive features, will be apparent from the description of the invention provided herein.

BRIEF SUMMARY OF THE INVENTION

The invention provides a chemical-mechanical polishing composition comprising (a) a cationic abrasive, (b) a cationic polymer selected from the group consisting of (1) about 0.1 ppm to about 50 ppm of a cationic homopolymer, (2) about 0.1 ppm to about 50 ppm of a cationic copolymer comprising at least one cationic monomer and at least one nonionic monomer, wherein the at least one cationic monomer comprises more than 50% of the cationic copolymer on a molar basis, and (3) about 0.1 ppm to about 200 ppm of a cationic copolymer comprising at least one cationic monomer and at least one nonionic monomer, wherein the at least one cationic monomer comprises 50% or less of the copolymer on a molar basis, and (c) water, wherein the polishing composition has a pH of about 7 or less. The invention further provides a method of chemically-mechanically polishing a substrate comprising (i) contacting a substrate with a polishing pad and a chemical-mechanical polishing composition comprising (a) a cationic abrasive, (b) a cationic polymer selected from the group consisting of (1) about 0.1 ppm to about 50 ppm of a cationic homopolymer, (2) about 0.1 ppm to about 50 ppm of a cationic copolymer comprising at least one cationic monomer and at least one nonionic monomer, wherein the at least one cationic monomer comprises more than 50% of the cationic copolymer on a molar basis, and (3) about 0.1 ppm to about 200 ppm of a cationic copolymer comprising at least one cationic monomer and at least one nonionic monomer, wherein the at least one cationic monomer comprises 50% or less of the copolymer on a molar basis, and (c) water, (ii) moving the polishing pad relative to the substrate with the chemical-mechanical polishing composition therebetween, and (iii) abrading at least a portion of the substrate to polish the substrate.

DETAILED DESCRIPTION OF THE INVENTION

The invention provides a chemical-mechanical polishing composition comprising (a) a cationic abrasive, (b) a cationic polymer (e.g., homopolymer or copolymer), and (c) water. The polishing composition desirably allows for selective removal of silicon nitride in preference to silicon dioxide during planarization of substrates comprising silicon nitride and silicon dioxide.

The polishing composition comprises a cationic abrasive. A cationic abrasive, in the context of the invention, comprises abrasive particles having a positive surface charge at the pH of the polishing composition. The surface charge of an abrasive particle can vary with pH. A desirable cationic abrasive is a cationic metal oxide abrasive. Preferably, the cationic metal oxide abrasive is selected from the group consisting of ceria, alumina, zirconia, titania, doped silica, and mixtures thereof. More preferably, the abrasive is ceria or zirconia. Most preferably, the abrasive is ceria.

The cationic metal oxide abrasive can be produced by any suitable process. Suitable processes for producing cationic metal oxide abrasive particles useful in the context of the invention include pyrogenic and hydrothermal processes. Fumed metal oxides can be produced from volatile precursors (e.g., metal halides) in a pyrogenic process by hydrolysis and/or oxidation of the precursors in a high temperature flame ($H_2$/air or $H_2$/$CH_4$/air) to produce the metal oxide of interest. Fumed metal oxides can be prepared from nonvolatile precursors by dissolving or dispersing the precursor in a suitable solvent such as water, alcohol, or acid-based solvent. The solution containing the precursor can be sprayed into a high temperature flame using a droplet generator, and the metal oxide can then be collected. Typical droplet generators include bi-fluid atomizers, high-pressure spray nozzles, and ultrasonic atomizers.

The cationic metal oxide abrasive can be a doped silica, for example, alumina-doped silica. Alumina-doped silicas are generally prepared by a co-fuming process in which mixtures of silicon tetrachloride and aluminum chloride are subjected to vapor phase hydrolysis, thus forming composite particles comprising aluminum oxide and silicon dioxide. Generally, silica particles have a negative, or anionic, surface charge, at a pH above the isoelectric point of the silica partices (e.g., about pH 3.5 or higher). The presence of an appropriate second metal oxide (e.g., aluminum oxide) renders the doped silica particles cationic. Desirably, about 0.01 wt. % or more (e.g., about 0.2 wt. % or more, or about 0.3 wt. % or more) of a second metal oxide is present in the doped silica particles. Preferably, about 2 wt. % or less (e.g., about 1.5 wt. % or less, or about 1 wt. % or less) of a second metal oxide is present in the doped silica particles. Examples of alumina-doped silicas are the MOX 80 and MOX 170 products (both containing about 1% alumina) available from Degussa.

As noted above, the cationic metal oxide abrasive can be produced by a hydrothermal process. In a hydrothermal process, a metal salt (e.g., a nitrate) having the same oxidation level as the desired metal oxide is dissolved in water, treated with a base (e.g., ammonium hydroxide), and subjected to conditions of elevated temperature and pressure. The hydrothermal process results in the conversion of the metal salt into the corresponding metal oxide.

Alternatively, a metal salt having a lower oxidation level than the desired metal oxide can be used in conjunction with an oxidizing agent in a hydrothermal process. For example, U.S. Pat. No. 5,389,352 discloses a process for preparing cerium oxide, which process comprises forming an aqueous solution comprised of a water-soluble trivalent cerium salt and an oxidizing agent, and then aging the solution as a liquid phase for a time during which the trivalent cerium salt is oxidized to cerium oxide particles.

Dopants comprising a second metal salt can be added to the first metal salt during a hydrothermal process to produce a doped metal oxide containing the second metal compound. Preferred dopants are selected from the group consisting of nickel, cobalt, manganese, iron, aluminum, chromium, and zinc. Any suitable amount of the second metal salt can be added to the first metal salt during the execution of a hydrothermal process. If a dopant is desired, typically about 1 ppm or more (e.g., about 10 ppm or more, or about 50 ppm or more, or even about 100 ppm or more) of a dopant can be added to the first metal salt during a hydrothermal process. Preferably, about 10000 ppm or less (e.g., about 5000 ppm or less, or about 1000 ppm or less, or about 500 ppm or less) of a dopant can be added to the first metal salt during a hydrothermal process.

The cationic abrasive particles desirably have an average particle size (typically, average particle diameter of the smallest spheres encompassing the particles) of at least about 10 nm or more (e.g., about 10 to about 1000 nm). Preferably, the abrasive particles have an average particle size of about 50 nm or more (e.g., about 50 to about 500 nm, or even about 50 to about 300 nm). More preferably, the abrasive particles have an average particle size of about 1000 nm or less (e.g., about 800 nm or less, or about 500 nm or less, or even about 300 nm or less).

The cationic abrasive can be present in the polishing composition in any suitable amount. The amount of cationic abrasive present in the polishing composition typically is about 0.001 wt. % or more (e.g., about 0.005 wt. % or more, or about 0.01 wt. % or more) based on the weight of the liquid carrier and any components dissolved or suspended therein. The amount of cationic abrasive present in the polishing composition preferably is about 5 wt. % or less (e.g., about 2 wt. % or less, or about 1 wt. % or less) based on the weight of the liquid carrier and any components dissolved or suspended therein. More preferably, the amount of cationic abrasive present in the polishing composition is about 0.01 wt. % to about 1 wt. %.

The abrasive desirably is suspended in the polishing composition, more specifically in the water component of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B]) in terms of g/ml) and the concentration of particles in the top 50 ml of the graduated cylinder ([T]) in terms of g/ml) divided by the initial concentration of particles in the abrasive composition ([C] in terms of g/ml) is less than or equal to 0.5 (i.e., {[B]-[T]}/[C]≦0.5). The value of [B]-[T]/[C] desirably is less than or equal to 0.3, and preferably is less than or equal to 0.1.

The polishing composition comprises a cationic polymer. The cationic polymer can be any suitable cationic polymer. The cationic polymer can be a cationic homopolymer or a cationic copolymer. The purpose of the cationic polymer is to reduce the removal rate of silicon dioxide as compared to the removal rate of silicon nitride for substrates comprising silicon dioxide and silicon nitride achievable by the polishing composition of the invention. Without wishing to be bound by any particular theory, it is believed that the cationic polymer is preferentially adsorbed onto the surface of the silicon dioxide. The cationic polymer is believed to form a protective film on the silicon dioxide surface to inhibit contact of the polishing composition with the silicon dioxide surface, thereby reducing the removal rate of silicon dioxide while advantageously not significantly affecting the rate of silicon nitride removal.

The cationic homopolymer can be any suitable cationic homopolymer consisting essentially of cationic monomer repeat units. For example, the cationic polymer can be any suitable cationic polymer consisting essentially of cationic repeat units comprising nitrogen, including but not limited to monomers comprising basic amine groups and quaternized amine groups. The basic amine groups or quatemized amine groups can be acyclic or incorporated into a ring structure. It is also suitable for the cationic polymer to be further modified by alkylation, acylation, ethoxylation, or other chemical reaction, in order to alter the solubility, viscosity, or other physical parameter of the cationic polymer. Preferably, the cationic polymer is selected from the group consisting of polyethyleneimine, ethoxylated polyethyleneimine, polydiallyldimethylammonium halide, poly(amidoamine), poly(methacryloxyloxyethyltrimethylammonium) chloride, poly (methacryloyloxyethyldimethylbenzylammonium) chloride, poly(vinylpyrrolidone), poly(vinylimidazole), poly(vinylpyridine), and poly(vinylamine). More preferably, the cationic polymer is polyethyleneimine.

The cationic polymer can be any suitable cationic homopolymer consisting essentially of monomers comprising sulfonium groups. Sulfonium groups comprise a sulfur atom substituted with three carbon atoms, with the sulfur atom having a positive charge. Non-limiting examples of cationic polymers and cationic monomers comprising sulfonium groups are disclosed in U.S. Pat. No. 4,528,384.

The cationic polymer can be any suitable cationic homopolymer consisting essentially of monomers comprising phosphonium groups. Phosphonium groups comprise a phosphorous atom substituted with four carbon atoms, with the phosphorous atom having a positive charge. Non-limiting example of cationic polymers and cationic monomers comprising phosphonium groups are disclosed in U.S. Pat. No. 5,439,617.

The cationic homopolymer can be any suitable transition metal oligomer having a net positive charge. For example, aluminum compounds can form cationic oligomeric species such as "poly-aluminum chloride," which refers to a class of soluble aluminum products in which aluminum chloride has been partly reacted with base, and which contains some of the highly cationic oligomers of aluminum. Other non-limiting examples of transition metal oligomers are found in, for example, "Comprehensive Organometallic Chemistry II," E. W. Abelm, F. G. A. Stone, and G. Wilkinson, eds., Pergamon Press (1995).

The cationic polymer can be a copolymer comprising at least one cationic monomer and at least one nonionic monomer, wherein the at least one cationic monomer comprises either more than 50% of the copolymer on a molar basis or about 50% or less of the copolymer on a molar basis. The cationic and nonionic monomers can be any suitable cationic and nonionic monomers.

For example, the cationic monomer can be any suitable cationic monomer(s) comprising nitrogen, including but not limited to monomers comprising basic amine groups and quatemized amine groups. The basic amine groups or quaternized amine groups can be acyclic or can be incorporated into a ring structure. Examples of cationic monomers usefil in the context of the invention include but are not limited to ethyleneimine, diallyldimethylammonium halide, methacryloxyloxyethyltrimethylammonium chloride, methacryloyloxyethyldimethylbenzylammonium chloride, 2-aminoethyl methacrylate, N-(3-aminopropyl)methacrylate, vinylimidazole, vinylpyridine, vinylamine, and amidoamines. The cationic monomers can comprise sulfonium and phosphonium groups. Sulfonium groups and phosphonium groups suitable for incorporation into the copolymers can be as set forth above. Preferably, the cationic monomer is ethyleneimine.

The nonionic monomer, for example, can be any suitable nonionic monomer(s), including but not limited to ethylene, propylene, ethylene oxide, propylene oxide, styrene, epichlorohydrin, acrylamide, and mixtures thereof.

The cationic copolymer can be prepared by any suitable technique. For example, the copolymer can be produced by free radical, cationic, anionic, or condensation polymerization. The copolymer can be a random copolymer, alternating copolymer, periodic copolymer, block copolymer (e.g., AB, ABA, ABC, etc.), graft copolymer, or comb copolymer. The cationic copolymer can be further modified by alkylation, acylation, ethoxylation, or other chemical reaction, in order to alter the solubility, viscosity, or other physical parameter of the copolymer.

The cationic polymer (i.e., cationic homopolymer or copolymer) can have any suitable average molecular weight. Preferably, the cationic polymer will have an average molecular weight of about 1,000 Daltons or more (e.g., about 5,000 Daltons or more, or about 10,000 Daltons or more, or about 50,000 Daltons or more, or even about 100,000 Daltons or more).

The amount of cationic polymer in the polishing composition depends on the nature of the cationic polymer. When the cationic polymer is a cationic homopolymer or a cationic copolymer comprising at least one cationic monomer and at least one nonionic monomer, wherein the cationic monomer comprises more than 50% of the cationic copolymer on a molar basis, then the amount of cationic polymer in the polishing composition is about 0.1 ppm to about 50 ppm based on the total weight of the polishing composition. Typically, the amount of cationic polymer will be about 0.5 ppm or more (e.g., about 1 ppm or more). Thus, the amount of cationic polymer in the polishing composition can be about 0.5 ppm to about 45 ppm (e.g., about 1 ppm to about 40 ppm), or about 2 ppm to about 35 ppm (e.g., about 3 ppm to about 30 ppm). When the cationic polymer is a cationic copolymer comprising at least one cationic monomer and at least one nonionic monomer, wherein the cationic monomer comprises 50% or less of the cationic copolymer on a molar basis, the amount of cationic polymer in the polishing composition can be about 0.1 ppm to about 200 ppm, based on the total weight of the polishing composition. In such an embodiment, typically the amount of cationic polymer will be about 0.1 ppm to about 200 ppm (e.g., about 5 ppm to about 200 ppm), or about 10 ppm to about 150 ppm (e.g., about 20 ppm to about 100 ppm). If the amount of the cationic polymer in the polishing composition is too low, then no effect resulting from addition of the cationic polymer is observed. If the amount of the cationic polymer in the polishing composition is too high, then suppression of silicon nitride removal occurs, thus lowering the ratio of silicon nitride removal to that of silicon dioxide removal, as well as reducing the overall polishing rate for the substrate below useful levels.

The cationic homopolymers and cationic copolymers of the invention allow for similar selectivity for removal of silicon nitride in preference to silicon dioxide in the chemical-mechanical polishing of substrates comprising silicon nitride and silicon oxide. Generally, the use of higher concentrations of the cationic copolymers in polishing compositions is required to achieve similar polishing performance as compared to polishing compositions comprising cationic homopolymers. Despite possible disadvantages of a requirement for use of larger amounts of cationic copolymers as compared to cationic homopolymers in polishing compositions, such as cost and supply requirements, the greater precision achievable in formulation of the polishing compositions having higher concentrations of cationic copolymers during the manufacturing process may be advantageous in some circumstances.

The polishing composition has a pH of about 7 or less (e.g., about 6 or less). Preferably, the polishing composition has a pH of about 1 or more (e.g., about 2 or more, or about 3 or more). Even more preferably, the polishing composition has a pH of about 4 to about 7 (e.g., about 4 to about 6). The polishing composition optionally comprises pH adjusting agents, for example, potassium hydroxide, ammonium hydroxide, alkylammonium hydroxides, and/or nitric acid. The polishing composition can optionally comprise pH buffering systems, for example, ammonium acetate or disodium citrate. Many such pH buffering systems are well known in the art.

The polishing composition optionally further comprises a carboxylic acid. Carboxylic acids useful in the polishing composition include monocarboxylic and dicarboxylic acids and their salts. The carboxylic acid can further comprise functional groups selected from the group consisting of hydroxyl, carbonyl, halogen, amine, and nitrogen-containing aromatic heterocycle. Preferably, the carboxylic acid is selected from the group consisting of acetic acid, propionic acid, butyric acid, benzoic acid, formic acid, malonic acid, succinic acid, tartaric acid, lactic acid, phthalic acid, salicylic acid, anthranilic acid, citric acid, glycolic acid, fumaric acid, lauric acid, pyruvic acid, stearic acid, chloroacetic acid, dichloroacetic acid, 2-pyridinecarboxylic acid, 2-piperidinecarboxylic acid, glycine, alanine, 3-aminopropionic acid, 4-aminobutyric acid, derivatives thereof, salts thereof, and combinations thereof.

The polishing composition can comprise any suitable amount of the carboxylic acid and when present typically comprises about 10 ppm or more (e.g., about 10 to about 1000 ppm). Preferably, the amount of carboxylic acid present in the polishing composition will be about 1000 ppm or less (e.g., about 800 ppm or less, or about 600 ppm or less).

It will be appreciated that the aforementioned carboxylic acids can exist in the form of a salt (e.g., a metal salt, an ammonium salt, or the like), an acid, or as a partial salt thereof. For example, tartrates include tartaric acid, as well as mono- and di-salts thereof. Furthermore, carboxylic acids including basic functional groups can exist in the form of an acid salt of the basic functional group. For example, glycines include glycine, as well as monoacid salts thereof. Furthermore, some carboxylic acids can function both as an acid and as a chelating agent (e.g., certain amino acids and the like).

The carboxylic acid serves several functions in the polishing composition. The carboxylic acid in conjunction with the cationic polymer serves to confer selectivity for removal of silicon nitride in preference to removal of silicon dioxide observed with the use of the inventive polishing composition by suppression of silicon dioxide removal. The carboxylic acid further serves to buffer the pH of the system and improves the colloidal stability of the polishing composition The polishing composition optionally further comprises one or more other additives. Such additives include any suitable surfactant and/or Theological control agent, including viscosity enhancing agents and coagulants (e.g., polymeric rheological control agents, such as, for example, urethane polymers), acrylates comprising one or more acrylic subunits (e.g., vinyl acrylates and styrene acrylates), and polymers, copolymers, and oligomers thereof, and salts thereof Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., acids, bases, etc.) as well as any combination of ingredients (e.g., acids, bases, surfactants, etc.).

For example, the cationic abrasive can be dispersed in water. The cationic homopolymer or copolymer and optional carboxylic acid can then be added, and mixed by any method that is capable of incorporating the components into the polishing composition. The polishing composition can be prepared prior to use, with one or more components, such as the cationic homopolymer or copolymer, added to the polishing composition just before use (e.g., within about 1 minute before use, or within about 1 hour before use, or within about 7 days before use). The pH can be adjusted at any suitable time. The polishing composition also can be prepared by mixing the components at the surface of the substrate during the polishing operation.

The polishing composition also can be provided as a concentrate which is intended to be diluted with an appropriate amount of water prior to use. In such an embodiment, the polishing composition concentrate can comprise a cationic abrasive, a cationic homopolymer or copolymer, a carboxylic acid, and water in amounts such that, upon dilution of the concentrate with an appropriate amount of water, each component of the polishing composition will be present in the polishing composition in an amount within the appropriate range recited above for each component. For example, the cationic abrasive, a cationic homopolymer or copolymer, and carboxylic acid can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the cationic homopolymer or copolymer, optional carboxylic acid, and other suitable additives are at least partially or fully dissolved in the concentrate.

The invention further provides a method of chemically-mechanically polishing a substrate comprising (i) contacting a substrate with a polishing pad and the polishing composition described herein, (ii) moving the polishing pad relative to the substrate with the polishing composition therebetween, and (iii) abrading at least a portion of the substrate to polish the substrate.

The method of the invention can be used to polish any suitable substrate, and is especially useful for polishing substrates comprising silicon nitride and silicon dioxide. Suitable substrates include wafers used in the semiconductor industry. The polishing composition is particularly well-suited for planarizing or polishing a substrate that has undergone shallow trench isolation (STI) processing. STI processing typically involves providing a silicon substrate on which is deposited a layer of silicon nitride. Trenches are etched onto a substrate comprising an overlying layer of silicon nitride following photolithography, and an excess of silicon dioxide is deposited thereon. The substrate is then subjected to planarization until the surface layer of silicon nitride is substantially removed, such that the silicon oxide remaining in the trenches is approximately level with the edges of the trenches. Desirably, the planarization or polishing is carried out in STI processing with the polishing composition of the invention, preferably such that the silicon nitride is substantially removed and the silicon dioxide is adequately planarized without excessive erosion of silicon dioxide within the trenches.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

In the examples below, the polishing experiments generally involved use of a 50.8 cm (20 inch) diameter polishing tool with 27.6 kPa (4 psi) downforce pressure of the substrate against the polishing pad, 60 rpm platen speed, 56 rpm carrier speed, 200 mL/min polishing composition flow rate, and use of in-situ conditioning of a concentric grooved CMP pad.

EXAMPLE 1

This example shows the effect of increasing amounts of a polyethyleneimine having an average molecular weight of 2000 Daltons on removal rates for silicon nitride and silicon dioxide layers observed with the polishing compositions of the invention.

Similar silicon nitride layers and silicon dioxide layers were separately polished with six different polishing compositions (Compositions 1A-1F). Each of the compositions comprised 0.4 wt. % ceria and 400 ppm of 4-aminobutyric acid at a pH of 4.9 in water. Composition 1A (control) contained no further ingredients (e.g., no polyethyleneimine). Compositions 1B-1F (invention) further comprised varying amounts of polyethyleneimine as set forth in Table 1. Following use of the polishing compositions, the silicon nitride ("nitride") and silicon dioxide ("oxide") removal rates were determined, and the selectivities, defined as the ratio of the silicon nitride to silicon dioxide removal rates, were calculated. The results are set forth in Table 1.

TABLE 1

Effect of increasing levels of polyethyleneimine on silicon nitride and silicon dioxide removal rates

| Polishing Composition | Polyethyleneimine (ppm) | Nitride Rate (Å/min) | Oxide Rate (Å/min) | Selectivity |
|---|---|---|---|---|
| 1A (control) | None (control) | 950 | 640 | 1.5 |
| 1B (invention) | 1 | 970 | 310 | 3.1 |
| 1C (invention) | 2 | 930 | 180 | 5.2 |
| 1D (invention) | 4 | 920 | 90 | 10.2 |
| 1E (invention) | 6 | 350 | 60 | 5.8 |
| 1F (invention) | 10 | 24 | 10 | 2.4 |

As is apparent from the data set forth in Table 1, increasing the amount of polyethyleneimine from none up to 4 ppm resulted in a negligible decrease in the removal rate of silicon nitride, while the removal rate for silicon dioxide decreased by approximately 86%. The selectivity as defined by the ratio of silicon nitride to silicon oxide removal rate increased from 1.5, with no polyethyleneimine present in the polishing composition, to 10.2, with 4 ppm of polyethyleneimine present in the polishing composition. Increasing the amount of polyethyleneimine in the polishing composition to 10 ppm resulted in a significant reduction in the removal rate for both layers. Thus, the results of this example demonstrate the dependence of silicon nitride and silicon dioxide removal rate on the amount of the cationic polymer in the polishing composition of the invention.

EXAMPLE 2

This example shows the effect of different cationic polymers on removal rates for silicon nitride and silicon dioxide layers observed with the polishing compositions of the invention.

Six different polishing compositions were used to separately chemically-mechanically polish similar silicon nitride layers and silicon dioxide layers (Compositions 2A-2F). Each of the compositions comprised 0.4 wt. % ceria and 400 ppm of 4-aminobutyric acid at a pH of 4.9 in water. Composition 2A (control) contained no further ingredients (e.g., no cationic polymer). Composition 2B (invention) additionally contained 8.5 ppm of polyethyleneimine (average molecular weight 25,000 Daltons). Composition 2C (invention) additionally contained 15 ppm of polydiallyldimethylammonium chloride (average molecular weight 60,000 Daltons). Composition 2D (invention) additionally contained 10 ppm of 80% ethoxylated polyethyleneimine (average molecular weight 50,000 Daltons). Composition 2E (invention) additionally contained 25 ppm of polyamidoamine (average molecular weight 1,000,000 Daltons). Following use of the polishing compositions, the silicon nitride ("nitride") and silicon dioxide ("oxide") removal rates were determined, and the selectivities, defined by the ratio of the silicon nitride to silicon dioxide removal rates, were calculated. The results are set forth in Table 2.

TABLE 2

Effect of different cationic polymers on silicon nitride and silicon dioxide removal rates

| Polishing Composition | Nitride Rate (Å/mm) | Oxide Rate (Å/min) | Selectivity |
|---|---|---|---|
| 2A (control) | 1012 | 558 | 1.8 |
| 2B (invention) | 861 | 33 | 26 |
| 2C (invention) | 876 | 65 | 13 |
| 2D (invention) | 1023 | 85 | 12 |
| 2E (invention) | 1200 | 156 | 7.7 |

As is apparent from the results set forth in Table 2, all of the inventive polishing compositions decreased the removal rate for silicon dioxide compared with the removal rate for silicon nitride, while maintaining high removal rates for silicon nitride, as compared to the control polishing composition. The use of polyethyleneimine with an average molecular weight of 25,000 daltons (Polishing Composition 2B) notably reduced the removal rate for silicon dioxide approximately 17 times, while reducing the silicon nitride removal rate only approximately 15%, as compared to the control polishing composition. Thus, the results of this example demonstrate the effects on removal rates for silicon nitride layers and silicon dioxide layers achievable by the polishing composition of the invention.

EXAMPLE 3

This example shows the effect of cationic polymers comprising different proportions of a cationic monomer and non-ionic monomer on removal rates for silicon nitride and silicon dioxide layers observed with the polishing compositions of the invention.

Five different polishing compositions were used to separately chemically-mechanically polish similar silicon nitride and silicon dioxide layers (Compositions 3A, 3B, 3C, 3D, and 3E). Each of the compositions comprised ceria and copolymers of acrylamide and diallyldimethylammonium chloride ("DADMAC") in water in which the molar fraction of DADMAC units in the copolymers was different. Composition 3A contained 20 ppm of a 5 mole % DADMAC copolymer with acrylamide. Composition 3B contained 20 ppm of a 15 mole % DADMAC copolymer with acrylamide. Composition 3C contained 20 ppm of a 30 mole % DADMAC copolymer with acrylamide. Composition 3D contained 20 ppm of a 100 mole % DADMAC copolymer with acrylamide (i.e., a homopolymer of DADMAC). Composition 3E contained 100 ppm of a 30 mole % DADMAC copolymer with acrylamide. Following use of the polishing compositions, the silicon nitride ("nitride") and silicon dioxide ("oxide") removal rates were determined, and the selectivities, defined as the ratio of the silicon nitride to silicon dioxide removal rates, were calculated. The results are set forth in Table 3.

TABLE 3

Effect of cationic copolymer of silicon nitride and silicon dioxide removal rates

| Polishing Composition | Cationic Polymer Amount (ppm) | Cationic Monomer Mole % | Nitride Rate (Å/min) | Oxide Rate (Å/min) | Selectivity |
|---|---|---|---|---|---|
| 3A | 20 | 5 | 1008 | 2000 | 0.5 |
| 3B | 20 | 15 | 1005 | 1732 | 0.6 |
| 3C | 20 | 30 | 1009 | 851 | 1.2 |
| 3D | 20 | 100 | 497 | 56 | 8.9 |
| 3E | 100 | 30 | 1032 | 63 | 16.4 |

As is apparent from the results set forth in Table 3, increasing the molar fraction of cationic monomer in the copolymer from 5 mole % to 30 mole % (Polishing Compositions 3A-3C) resulted in an approximately 2.4-fold reduction in the oxide removal rate, with negligible effect on nitride rate. The use of the same amount of the corresponding cationic homopolymer (Polishing Composition 3D) reduced the removal rate of nitride approximately 2-fold as compared to compositions comprising the cationic copolymers, but improved the selectivity to 8.9. The use of a greater amount (i.e., 100 ppm) of a 30 mole % DADMAC-acrylamide copolymer (Polishing Composition 3E) improved the selectivity ratio to 16.4 with a negligible effect on nitride rate. Thus, the results of this example demonstrate the effects on removal rates for silicon nitride layers and silicon dioxide layers achievable by the polishing composition of the invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of chemically-mechanically polishing a substrate comprising silicon nitride and silicon oxide, which method comprises:
   (i) contacting a substrate with a polishing pad and a chemical-mechanical polishing composition comprising:
      (a) a cationic abrasive,
      (b) a cationic polymer selected from the group consisting of (1) about 0.1 ppm to about 50 ppm of a cationic homopolymer, (2) about 0.1 ppm to about 50 ppm of a cationic copolymer comprising at least one cationic monomer and at least one nonionic monomer, wherein the at least one cationic monomer comprises more than 50% of the cationic copolymer on a molar basis, and (3) about 0.1 ppm to about 200 ppm of a cationic copolymer comprising at least one cationic monomer and at least one nonionic monomer, wherein the at least one cationic monomer comprises 50% or less of the copolymer on a molar basis, and
      (c) water,
         wherein the polishing composition has a pH of about 7 or less,
   (ii) moving the polishing pad relative to the substrate with the chemical-mechanical polishing composition therebetween, and
   (iii) abrading at least a portion of the substrate to polish the substrate, wherein the silicon nitride is selectively removed in preference to the silicon oxide.

2. The method of claim 1, wherein the cationic abrasive is selected from the group consisting of alumina, titania, and doped silica.

3. The method of claim 1, wherein the cationic abrasive is ceria.

4. The method of claim 1, wherein the cationic abrasive is zirconia.

5. The method of claim 1, wherein the cationic abrasive is present in an amount of about 0.01 wt. % to about 1 wt. %.

6. The method of claim 1, wherein the cationic polymer is a cationic homopolymer.

7. The method of claim 6, wherein the cationic homopolymer is selected from the group consisting of ethoxylated polyethyleneimine, polydiallyldimethylammonium halide, poly(amidoamine), poly(methacryloyloxyethyltrimethylammonium)chloride, poly(methacryloyloxyethyldimethylbenzylammonium)chloride, poly(vinylpyrrolidone), poly(vinylimidazole), poly(vinylpyridine), and poly(vinylamine).

8. The method of claim 6, wherein the cationic homopolymer is polyethyleneimine.

9. The method of claim 8, wherein polyethyleneimine is present in the polishing composition in an amount of about 0.1 ppm to about 20 ppm.

10. The method of claim 6, wherein the cationic homopolymer is a cationic transition metal oligomer.

11. The method of claim 1, wherein the cationic polymer is a cationic copolymer.

12. The method of claim 11, wherein the cationic polymer comprises at least one monomer selected from the group consisting of diallyldimethylammonium halide, methacryloyloxyethyltrimethylammonium chloride, methacryloyloxyethyldimethylbenzylammonium chloride, 2-aminoethyl methacrylate, N-(3-aminopropyl)methacrylate, vinylimidazole, vinylpyridine, vinylamine, and amidoamine.

13. The method of claim 11, wherein the cationic monomer is ethyleneimine.

14. The method of claim 1, wherein the cationic polymer has an average molecular weight of about 5000 Daltons or more.

15. The method of claim 14, wherein the cationic polymer comprises nitrogen, sulfonium groups, phosphonium groups, or a combination thereof.

16. The method of claim 11, wherein the pH is about 4 to about 7.

17. The method of claim 11, wherein the polishing composition further comprises a carboxylic acid.

18. The method of claim 17, wherein the carboxylic acid is an amino carboxylic acid.

* * * * *